US011378639B2

(12) United States Patent
Stainsby et al.

(10) Patent No.: US 11,378,639 B2
(45) Date of Patent: *Jul. 5, 2022

(54) SYSTEM AND METHOD TO REDUCE EDDY CURRENT ARTIFACTS IN MAGNETIC RESONANCE IMAGING

(71) Applicant: SYNAPTIVE MEDICAL INC., Toronto (CA)

(72) Inventors: Jeff Alan Stainsby, Toronto (CA); Chad Tyler Harris, Toronto (CA)

(73) Assignee: SYNAPTIVE MEDICAL INC., Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 16/983,745

(22) Filed: Aug. 3, 2020

(65) Prior Publication Data

US 2020/0363488 A1    Nov. 19, 2020

Related U.S. Application Data

(63) Continuation of application No. 15/601,213, filed on May 22, 2017, now Pat. No. 10,732,248.

(51) Int. Cl.
*G01R 33/565* (2006.01)
*G01R 33/58* (2006.01)

(52) U.S. Cl.
CPC . *G01R 33/56572* (2013.01); *G01R 33/56518* (2013.01); *G01R 33/58* (2013.01)

(58) Field of Classification Search
CPC .............. G01R 33/58; G01R 33/56518; G01R 33/56572
See application file for complete search history.

(56) References Cited

U.S. PATENT DOCUMENTS

| 5,332,969 | A | 7/1994 | Tsuruno |
| 5,367,261 | A | 11/1994 | Frederick et al. |
| 5,497,773 | A | 3/1996 | Kuhara |

(Continued)

FOREIGN PATENT DOCUMENTS

GB    2434000    7/2007

OTHER PUBLICATIONS

Addy et al, "A Simple Method for MR Gradient System Characterization and k-Space Trajectory Estimation," MRM, 2012, 68(1): 120-129.

(Continued)

*Primary Examiner* — Dixomara Vargas

(57) ABSTRACT

Some implementations provide a system that includes: a housing having a bore in which a subject to be image is placed; a main magnet configured to generate a volume of magnetic field within the bore, the volume of magnetic field having inhomogeneity below a defined threshold; one or more gradient coils configured to linearly vary the volume of magnetic field as a function of spatial location; one or more pulse generating coils configured to generate and apply radio frequency (RF) pulses to the volume of magnetic field in sequence to scan the portion of the subject; one or more shim gradient coils configured to perturb a spatial distribution of the linearly varying volume of magnetic field; and a control unit configured to operate the gradient coils, pulse generating coils, and shim gradient coils such that only the user-defined region within the volume of magnetic field is imaged.

25 Claims, 7 Drawing Sheets

(56) References Cited

U.S. PATENT DOCUMENTS

| | | | |
|---|---|---|---|
| 5,722,409 | A | 3/1998 | Kuhara et al. |
| 6,815,952 | B1 | 11/2004 | Rose |
| 7,034,537 | B2 | 4/2006 | Tsuda et al. |
| 7,622,922 | B2 | 11/2009 | Daniels et al. |
| 9,903,922 | B2 | 2/2018 | Weinberg et al. |
| 10,338,180 | B2 | 7/2019 | McMillan |
| 10,545,212 | B2 | 1/2020 | Curtis |
| 10,732,248 | B2* | 8/2020 | Stainsby .......... G01R 33/56518 |
| 2004/0113620 | A1 | 6/2004 | Tsuda et al. |
| 2004/0227510 | A1 | 11/2004 | Rose |
| 2006/0022674 | A1 | 2/2006 | Zhou et al. |
| 2007/0080685 | A1* | 4/2007 | Bydder ................ G01R 33/561 324/309 |
| 2007/0159168 | A1 | 7/2007 | Schneider |
| 2012/0074938 | A1* | 3/2012 | Grodzki ................ A61B 5/055 324/309 |
| 2012/0076383 | A1* | 3/2012 | Grodzki ............. G01R 33/4816 382/131 |
| 2012/0076384 | A1* | 3/2012 | Grodzki ............. G01R 33/4828 382/131 |
| 2013/0234708 | A1 | 9/2013 | Goora |
| 2014/0218031 | A1 | 8/2014 | Lee et al. |
| 2014/0227513 | A1 | 8/2014 | Kiuchi et al. |
| 2015/0115956 | A1 | 4/2015 | Ackerman |
| 2015/0309134 | A1 | 10/2015 | Meakin et al. |
| 2017/0102439 | A1 | 4/2017 | McMillan et al. |
| 2018/0335495 | A1* | 11/2018 | Stainsby .......... G01R 33/56518 |
| 2019/0025397 | A1 | 1/2019 | Harris |
| 2019/0064301 | A1 | 2/2019 | Curtis |
| 2019/0377050 | A1 | 12/2019 | Ennis et al. |
| 2020/0018806 | A1 | 1/2020 | Rothberg |

OTHER PUBLICATIONS

Boesch et al, "Temporal and spatial analysis of fields generated by eddy currents in superconducting magnets: optimization of corrections and quantitative characterization of magnet/gradient systems," MRM, 1991, 20(2):268-84.

GB Search Report Under Section 17(5) in British Appln. No. GB 1807908.7, dated Dec. 5, 2018, 3 pages.

Goora et al, "Arbitrary magnetic field gradient waveform correction using an impulse response based preequalization technique," JMR, 2014, 238:70-76.

Jehensen et al, "Analytical method for the compensation of eddy-current effects induced by pulsed magnetic field gradients in NMR systems," JMR, 1990, 90(2):264-278.

Office Action issued by the Canadian Intellectual Property Office in relation to corresponding Canadian Application No. 3,005,572 dated Mar. 21, 2019, 3 pgs.

Robertson et al, "Analysis of the temporal and spatial dependence of the eddy current fields in a 40-cm bore magnet," MRM, 1992, 25(1):158-66.

Van Vaals, et al, "Optimization of eddy-current compensation," JMR, 1990, 90(1):52-70.

Vannesjo et al, "Field Camera Measurements of Gradient and Shim Impulse Responses Using Frequency Sweeps," MRM, 2014, 72:570-583.

Vannesjo et al, "Gradient input optimization based on the measured system frequency response," Proc. Intl. Soc. Magn. Reson. Med., 2016, 20:2-4.

\* cited by examiner

300B

SYSTEM AND METHOD TO REDUCE EDDY CURRENT ARTIFACTS IN MAGNETIC RESONANCE IMAGING

CROSS-REFERENCE TO RELATED APPLICATIONS

The present application is a continuation of U.S. patent application Ser. No. 15/601,213, filed May 22, 2017, now allowed. The contents of the prior application are incorporated herein by reference in their entirety.

BACKGROUND

The present disclosure relates to techniques for reducing image artifacts in magnetic resonance imaging.

SUMMARY

In one aspect, some implementations provide a method for reducing eddy current artifacts of a magnetic resonance imaging (MRI) system that has a main magnet that generates a substantially uniform magnetic field to image a subject therein. The method includes the operations of: energizing a gradient sub-system of the MRI system such that a gradient corresponding to perturbations to the substantially uniform magnetic field are generated, the gradient having a temporal strength that includes a ramp-up phase; measuring the temporal strength of the gradient during the ramp-up phase; and fitting the measured temporal strength during the ramp-up phase simultaneously against one or more temporal model functions characterized. The measured temporal strength is fitted by at least a first set of time constants and a second set of time constants. The first set of time constant and the second set of time constants are derived and then incorporated into a pre-emphasized gradient waveform which, when used to energize the gradient sub-system for imaging the subject placed in the main magnet, generates a corrected gradient in which distortions caused by eddy currents during the ramp-up phase are substantially removed.

Implementations may include one or more of the following features. The operation of measuring the temporal strength of the gradient can include: recording radio frequency (RF) signals from a field camera having more than one probes placed in the substantially uniform magnetic field; and measuring cumulative phases of the recorded RF signals that reflect the perturbations to the substantially uniform magnetic field at where the more than one probes were placed.

In some implementations, measuring the temporal strength of the gradient further includes: determining the temporal strength of the gradient by taking a time derivative of the measured cumulative phase.

In some implementations, fitting the measured temporal strength during the ramp-up phase includes simultaneously fitting against a first temporal model function characterized by the first set of time constants as well as a second temporal model function characterized by the first set of time constants and the second set of time constants.

In some implementations, fitting the measured temporal strength during the ramp-up phase comprises applying a fit only during the ramp-up phase.

In some implementations, the corrected gradient is generated such that radio-frequency (RF) signals for reconstructing an MRI image of the subject are acquired from a k-space trajectory that is substantially identical to the ideal gradient waveform.

In some implementations, the method further includes: accessing data encoding a computational model for one or more components of the gradient sub-system, wherein the computational model specifies ideal gradient amplitudes for each of the one or more components when the gradient corresponding to the perturbations to the substantially uniform magnetic field is generated; determining measured gradient amplitudes of the one or more components after energizing the gradient sub-system; comparing, for each of the one or more components of the gradient sub-system, the measured gradient amplitude and the ideal amplitude specified by the computational model; and determining the set of time constants and the second set of time constants based on the comparison of the measured gradient amplitude and the ideal gradient amplitude for each of the one or more components of the gradient sub-system.

In some implementations, the gradient runs along at least one spatial axis within the main magnetic field.

In some implementations, the method for reducing eddy current artifacts of the MRI system are performed by a computing system including one or more computers, and one or more storage devices storing instructions that, when executed by the one or more computers, cause the one or more computers to perform operations of the method.

In another aspect, some implementations provide a method for reducing eddy current artifacts of a magnetic resonance imaging (MRI) system that has a main magnet that generates a substantially uniform magnetic field to image a subject therein. The method includes the operations of: accessing data encoding a gradient waveform that would otherwise be used on a gradient sub-system of the MRI system to generate a gradient that corresponds to perturbations to the substantially uniform magnetic field; accessing data encoding one or more temporal model functions indicative of a first rising portion immediately followed by a second decaying portion during a ramp-up phase of the gradient; pre-emphasizing the gradient waveform to correct deviations characterized by the first rising portion and the subsequent second decaying portion; and driving the gradient sub-system using the pre-emphasized gradient waveform such that distortions to the gradient caused by eddy currents during the ramp-up phase are substantially removed.

Implementations may include one or more of the following features. The method can further include the operation of receiving and sampling radio-frequency (RF) signals from the subject placed in the main magnetic field when the gradient sub-system is being driven using the pre-emphasized gradient waveform as if the gradient sub-system is being driven using the gradient waveform.

In some implementations, pre-emphasizing the gradient waveform includes the operations of taking a time derivative of the gradient waveform; and convolving the one or more temporal model functions with the time derivative of the gradient waveform.

In some implementations, pre-emphasizing the gradient waveform includes the operation of subtracting, from the gradient waveform, results of convolving the one or more temporal model functions with the time derivative of the gradient waveform.

In some implementations, pre-emphasizing the gradient waveform includes the operation of adding, from the gradient waveform, results of convolving the one or more temporal model functions with the time derivative of the gradient waveform.

In some implementations, the gradient corresponds to perturbation to the main magnetic field along at least one spatial axis.

In some implementations, the gradient waveform represents at least one of a gradient echo acquisition, a spin echo acquisition, an echo-planar imaging (EPI) acquisition, or a spiral acquisition.

In some implementations, the gradient waveform leads to an accumulation of phase errors caused by eddy currents, and wherein the accumulation of phase errors is substantially removed by the pre-emphasized gradient waveform.

In another aspect, some implementations provide a magnetic resonance imaging (MRI) system that includes: a housing having a bore in which a subject to be imaged is placed; a main magnet accommodated by said housing and configured to generate a substantially uniform magnet field within the bore; a group of shimming coils placed around said housing and configured to increase a homogeneity of the magnetic field; pulse generating coils to generate and apply radio frequency (RF) pulses in sequence to scan the subject; a gradient sub-system comprising gradient coils to provide perturbations to the substantially uniform magnet field; and a control unit coupled to the main magnet and configured to perform operations.

The operations performed by the control unit include: accessing data encoding a gradient waveform that would otherwise be used on the gradient sub-system to generate a gradient that corresponds to the perturbations to the substantially uniform magnet field; accessing data encoding one or more temporal model functions indicative of a first rising portion followed by a second decaying portion during a ramp-up phase of the gradient; pre-emphasizing the gradient waveform to correct deviations characterized by the first rising portion and the subsequent second decaying portion; and driving the gradient sub-system using the pre-emphasized gradient waveform such that distortions to the gradient caused by eddy currents during the ramp-up phase are substantially removed and MRI signals are acquired from the subject accordingly in response to the applied RF pulses.

Implementations may include one or more of the following features. The control unit is configured to perform the operation of receiving and sampling radio-frequency (RF) signals from the subject placed in the main magnetic field when the gradient sub-system is being driven using the pre-emphasized gradient waveform as if the gradient sub-system is being driven using the gradient waveform.

In some implementations, the control unit is configured to pre-emphasize the gradient waveform by taking a time derivative of the gradient waveform; and convolving the one or more temporal model functions with the time derivative of the gradient waveform.

In some implementations, the control unit is configured to pre-emphasize the gradient waveform by subtracting, from the gradient waveform, results of convolving the temporal model functions with the time derivative of the gradient waveform.

In some implementations, the gradient corresponds to perturbation to the substantially uniform magnetic field along at least one spatial axis.

In some implementations, the gradient waveform represents at least one of a gradient echo acquisition, a spin echo acquisition, an echo-planar imaging (EPI) acquisition, or a spiral acquisition.

In some implementations, the gradient waveform leads to an accumulation of phase errors caused by eddy currents of the gradient sub-system, and wherein the accumulation of phase errors is substantially removed by the pre-emphasized gradient waveform.

In another aspect, some implementations provide a second magnetic resonance imaging (MRI) system including: a housing having a bore in which a subject to be imaged is placed; a main magnet accommodated by said housing and configured to generate a substantially uniform magnet field within the bore; a group of shimming coils placed around said housing and configured to increase a homogeneity of the magnetic field; pulse generating coils to generate and apply radio frequency (RF) pulses in sequence to scan the subject; a gradient sub-system comprising gradient coils to provide perturbations to the substantially uniform magnet field, and a control unit coupled to the main magnet and configured to perform operations.

The operations performed by the control unit include: energizing a gradient sub-system of the MRI system such that a gradient corresponding to perturbations to the substantially uniform magnetic field are generated, the gradient having a temporal strength that includes a ramp-up phase; measuring the temporal strength of the gradient during the ramp-up phase; and exporting data encoding the measured temporal strength during the ramp-up phase. The measured temporal strength is fitted simultaneously against one or more temporal model functions characterized by at least a first set of time constants and a second set of time constants. The first set of time constants and the second set of time constants are derived and then incorporated into a pre-emphasized gradient waveform which, when used to energize the gradient sub-system for imaging the subject placed in the main magnet, generates a corrected gradient in which distortions caused by eddy currents during the ramp-up phase are substantially removed.

Implementations may include one or more of the following features. The control unit is configured to measure the temporal strength of the gradient by recording radio frequency (RF) signals from a field camera having more than one probes placed in the substantially uniform magnetic field. The cumulative phases of the recorded RF signals are measured, which reflect the perturbations to the substantially uniform magnetic field at where the more than one probes were placed.

In some implementations, the cumulative phases of the recorded RF signals are measured by taking a time derivative of the measured cumulative phase to determine the temporal strength of the gradient.

In some implementations, the measured temporal strength is fitted simultaneously against one or more temporal model functions. The measured temporal strength is simultaneously fitted against a first temporal model function characterized by the first set of time constants as well as a second temporal model function characterized by the first set of time constants and the second set of time constants.

In some implementations, the measured temporal strength is fitted simultaneously by a fit only during the ramp-up phase.

In some implementations, the corrected gradient is generated such that radio-frequency (RF) signals for reconstructing an MRI image of the subject are acquired from a k-space trajectory that is substantially identical to when the corrected gradient is uncorrected.

In some implementations, the gradient runs along at least one spatial axis within the main magnetic field.

The details of one or more aspects of the subject matter described in this specification are set forth in the accompanying drawings and the description below. Other features,

DETAILED DESCRIPTION

Figure 1A:
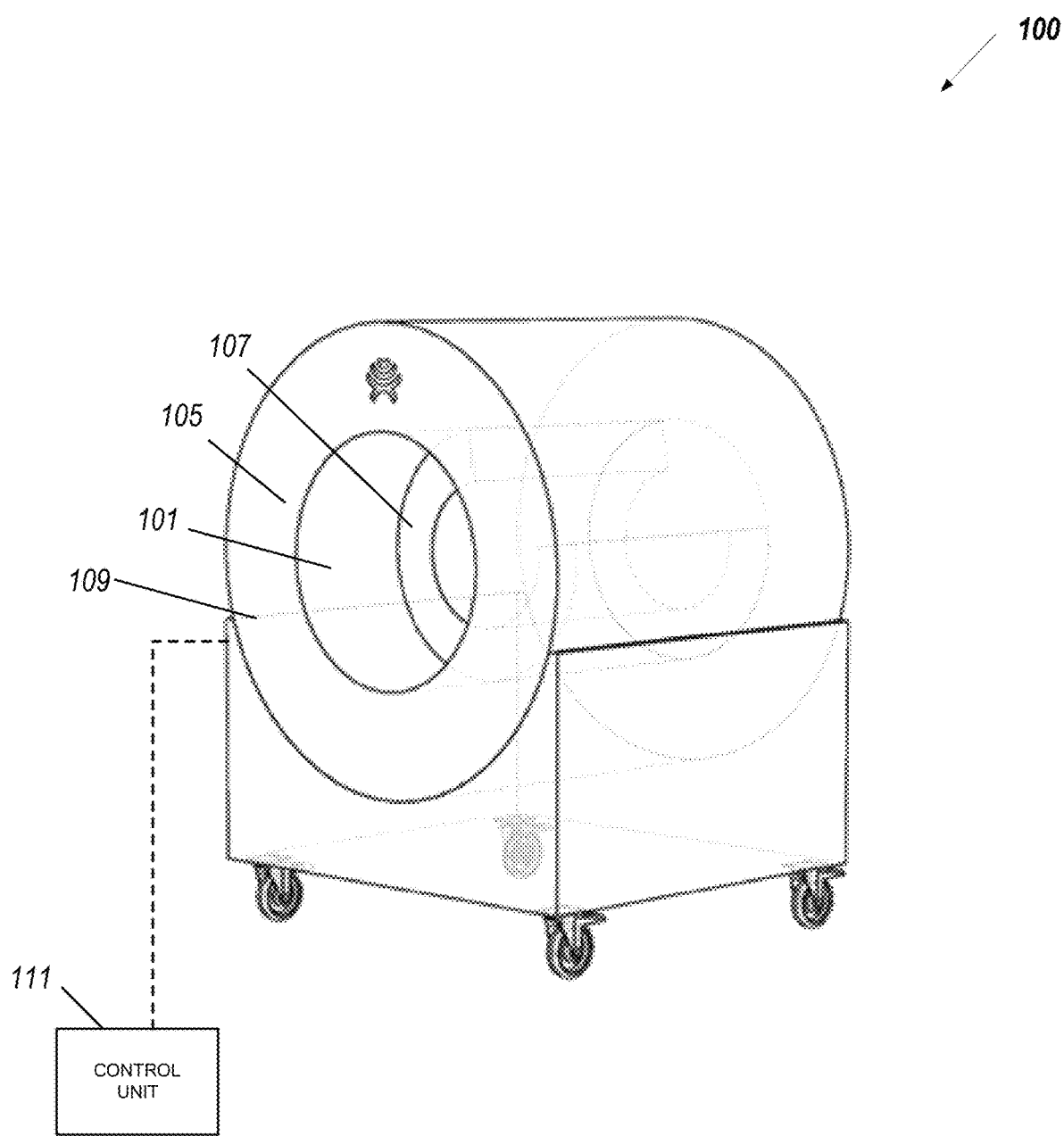
FIGS. 1A-1B show examples of a magnetic resonance imaging (MRI) system.

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

In magnetic resonance imaging (MRI) systems, a main magnet generates a highly uniform static magnetic field over a certain volume for imaging purposes. The region of uniformity, also referred to as the uniform magnetic field or main field homogeneity, is typically characterized by the maximum static field deviation over a certain spherical volume. The main magnet is designed to achieve a specific homogeneity (e.g., an inhomogeneity below the threshold) in order to generate an MR image for the imaging volume. When a subject (e.g., a human head) is inserted into the MRI scanner, tissue and any implantable devices in the subject may also affect the homogeneity of the imaging. The homogeneity can typically be improved through fine adjustment of active shimming coils such that the specific homogeneity is met. Gradient coils generally provide field gradients that generate field fluctuations along certain directions for the uniform magnetic field. Such field fluctuations may cause magnetizations from various spatial locations to experience precessions at different frequencies, enabling encoding of spatial information of the magnetizations through RF excitation pulses.

Time-varying gradient fields generated by gradient coils during a MR imaging sequence can often result in the induction of undesirable time-varying eddy currents in nearby conductive materials. For instance, the induced eddy currents produce parasitic magnetic fields that often erode the quality of an image acquired during the MR image sequence.

The adverse impact of such eddy currents on image quality (e.g., image artifacts) can be reduced by the application of pre-emphasis pulse sequences when the conductive materials upon which such eddy currents have been induced are limited to components within the MRI system. For example, pre-emphasis sequences can be applied to initially measure amplitude, time-dependence, and spatial distribution of the parasitic magnetic fields. The magnetic fields can then be decomposed spatially into a linear, or more generally a spherical harmonic, basis set and temporally into a series of exponentials. The exponentials can then be used in a pre-compensation network to adjust the waveforms applied by a specific gradient coil, or set of electromagnets (composed of gradient and shim coils), to reduce the undesirable effects of the parasitic magnetic fields.

However, while conventional pre-emphasis techniques can be effective for medium to long time constant eddy currents (e.g., in the range of 1 ms to 500 ms), such techniques are often ineffective for eddy currents with short time constants on the same order as the rise time of the gradient waveforms (e.g., less than 1 ms). This is primarily due to problems associated with reliably and accurately measuring the parasitic fields corresponding to such short time constants. For example, conventional pre-emphasis techniques often involve measuring eddy currents after gradient waveforms have been generated and applied when most of the short time constant eddy current has already decayed away once the waveform has finished ramping. While not correcting for short-time constant eddy currents often does not significantly impact most Cartesian imaging sequences, this can be problematic for non-Cartesian acquisitions (e.g., spiral sequences). When the parasitic fields are composed solely of linear terms, this results in additional gradient delays that must be adjusted on a sequence by sequence basis. When the parasitic fields contain high-order spatial components (e.g. $2^{nd}$ order spherical harmonics), there can be significant blurring of the image.

According to selected embodiments, techniques can be used to measure a residual error of a gradient waveform during a ramp-up stage of a gradient waveform due to the presence of induced short time constant eddy currents in nearby conductive materials of an MRI system. The residual error can be measured during the application of the gradient waveform such that amplitudes and time constants associated with eddy currents that are present during the ramp-up phase but degrade after the ramp-up phase can be measured.

For example, prior to conducting an imaging sequence, a magnetic field camera can be used to measure a gradient field produced by a gradient coil after the application of a gradient waveform. The measured gradient field can be compared to an ideal gradient waveform in order to determine the residual error between the two caused by the presence of eddy currents in nearby conductive materials. The time constants and the amplitude of the included current can be derived by fitting time-dependent difference between the ideal and measured gradients during the ramp-up phase to one or more temporal model functions. The derived time constants and amplitude can then be used to compute a pre-emphasized gradient waveform that, when applied, causes the gradient coils to generate a compensated gradient waveform that substantially removes the error caused by the induced eddy currents present within the nearby conductive materials.

Figure 1B:
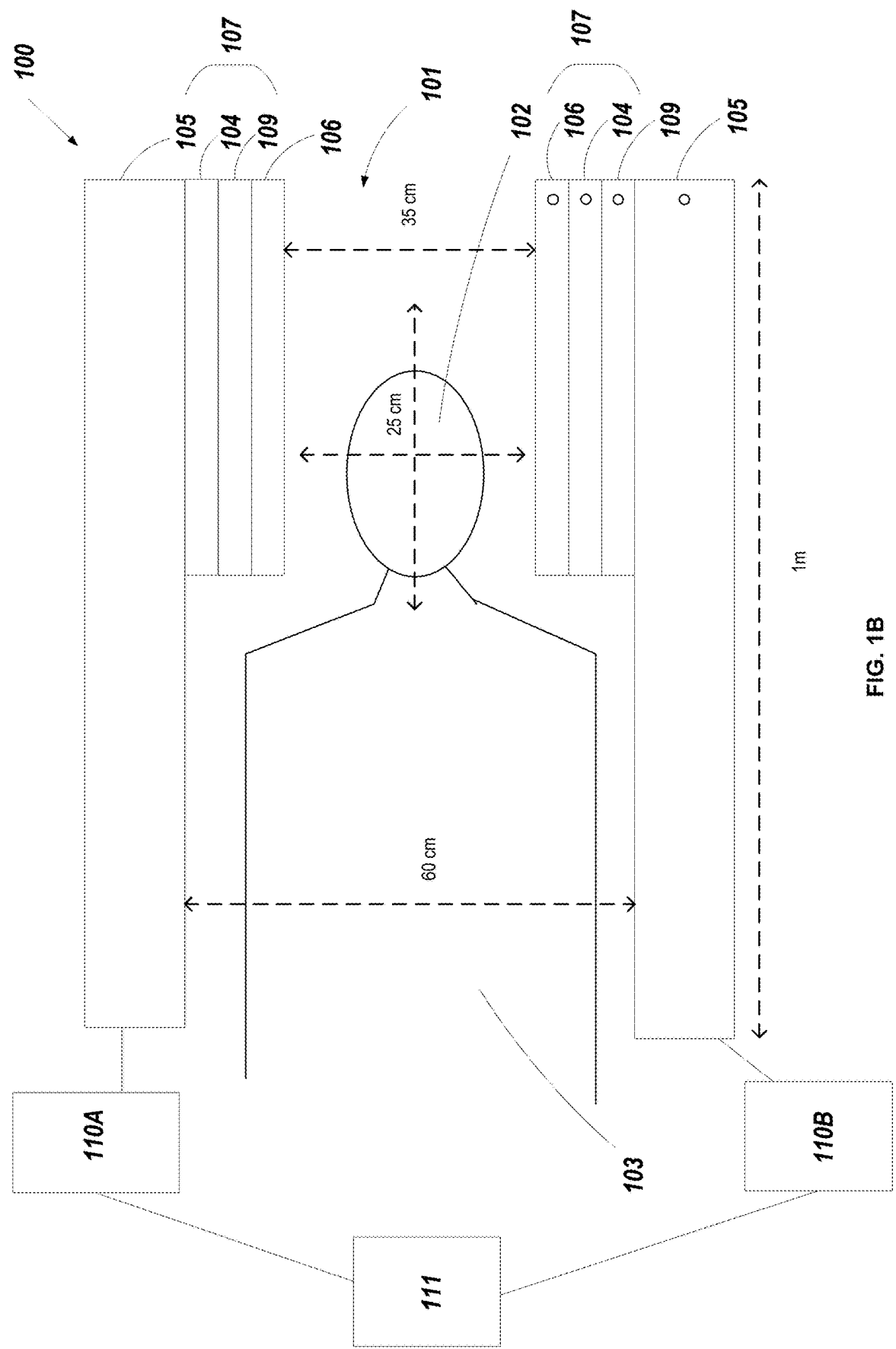

FIGS. 1A-1B show a perspective view and a cross-sectional view of an example of a magnetic resonance imaging (MRI) system 100 in which a solenoid magnet 105 is provided in a cylindrical shape housing with an inner bore 101. Coil assembly 107, including a pulse generating coil 106 and a gradient coil 104, is provided within solenoid magnet 105.

Coil assembly 107 may generally be shaped as an annular structure and housed within the inner bore of solenoid magnet 105. In some implementations, annular coil assembly 107 only includes one or more gradient coil 104. The Gradient coils 104 generally provide field gradients in more than one direction, such as, for example, all three orthogonal spatial directions. Thus, gradient coil 104 may refer to three sets of coils, each configured to generate field fluctuations in a respective direction for the main field in the inner bore of the solenoid magnet 105. Such field fluctuations may cause magnetizations from various spatial locations to experience precessions at different frequencies, enabling encoding of spatial information of the magnetizations through RF excitation pulses. The pulse generating coil 106 can be configured to generate and apply RF pulses to the volume of magnetic field in sequence to scan a portion of patient 103 (e.g., the head region 102).

For context, the main magnet of the MRI system 100 generates a highly-uniform static magnetic field over a certain volume for imaging purposes. Although small static field variations on the order of parts per million (ppm) can be tolerated, it is not possible to generate MR data in locations where the main field deviates too greatly (e.g., over hundreds of ppm over a 20 centimeter diameter spherical volume).

The main magnet is designed to achieve a specific homogeneity (that is, the main magnet is designed to have an inhomogeneity below the threshold). However, the actual homogeneity at the installation site may be affected by material in or around the MRI scanner. At the time of installation, passive and/or active shim coils (e.g., the shim gradient coils 109) may be applied to improve the homogeneity so that it meets the specific homogeneity the main magnet is designed to achieve before subjects are placed in the inner bore 101.

When a subject (i.e. a human head) is inserted into the MRI scanner, the tissue and any implantable devices in the subject may also affect the homogeneity of the imaging volume and the homogeneity is again typically improved through fine adjustment of active shim coils, such as for example, through shim coils 109, so that the specific homogeneity is met.

Shim coils 109 are housed within the cylindrical walls of solenoid magnet 105. Shim coils 109 are powered by a group of power amplifiers 110A and 110B. In some cases, the power amplifiers 110A and 110B are housed in a control room and are connected to shim coils 109 to provide shimming of the magnetic field within inner bore 101. In driving shim coils 109, power amplifiers 110A and 110B are controlled by a control unit 111. The driving current for shim coils 109 may be in the range of hundreds of milli-amperes and generally may not exceed 10 ampere. Further, shim coils 109 may not require active cooling using circulating coolant. In these implementations, an array of shimming coils can be used to provide adjustment to the field strength within the inner bore 101 such that the magnet field within the inner bore 101 becomes more homogenous. The shimming coils 109 produce spatial magnetic field perturbations, which are in well-defined polynomial spatial patterns (e.g. xy, $x^2$, $y^2$). In some implementations, the shimming coils 109 can by dynamically configured to produce arbitrary spatially varying patterns in the magnetic field.

The control unit 111 generally includes one or more processors as well as programming logic to configure the power amplifiers 110A and 110B to adjust the operation of the components of the system 100. As described more specifically below, the control unit 111 can be configured to operate a field camera to measure a temporal strength of a gradient field produced by the gradient coil 104 during a ramp-up phase in response to applying a gradient waveform. The control unit 111 can then fit the measured temporal strength simultaneously against one or more temporal model functions as described below in order to compute a pre-emphasized gradient waveform to apply to the gradient coils 104 to remove distortions caused by induced eddy currents within nearby conductive components of the MRI system 100.

As described in more detail below, the control unit 111 can be configured to pre-emphasize the gradient waveform using various techniques. In some instances, the control unit 111 computes a time derivative of the gradient waveform, and convolves the temporal model functions with the time derivative of the gradient waveform. As an example, the control unit 111 may subtract the results of the convolution from the original gradient waveform in order to generate the pre-emphasized gradient waveform.

In some implementations, once the pre-emphasized gradient waveform is applied, the control unit 111 can also receive and sample radio-frequency (RF) signals from a portion 102 of the subject 103 placed within the inner bore 101 when the gradient coils 104 are being driven using the pre-emphasized gradient waveform. For instance, the control unit 111 can automatically reconstruct an MRI image that is acquired based on sampling the RF signals.

Figure 2:
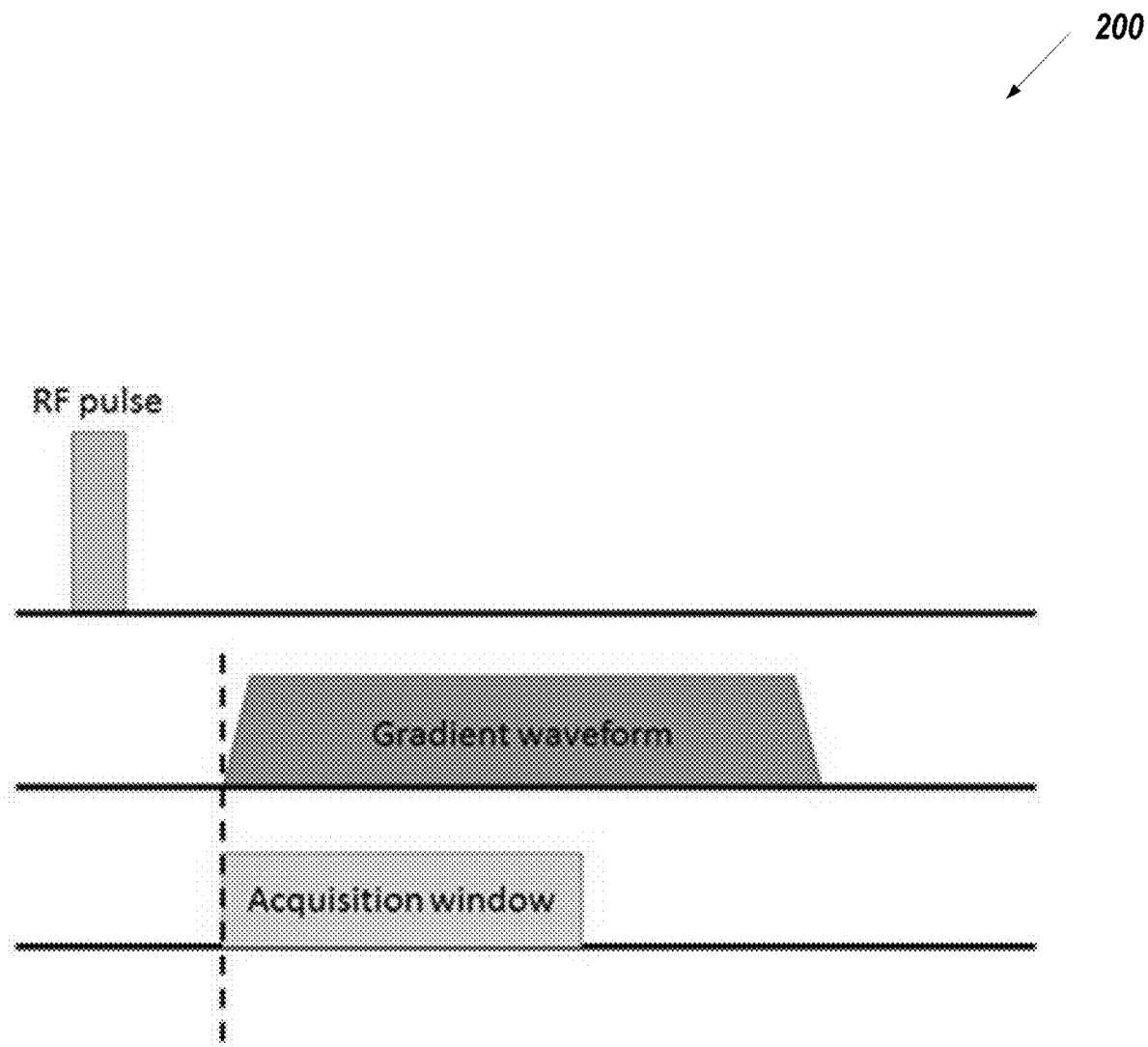
FIG. 2 shows an example of an acquisition sequence for measuring gradient fields during a ramp-up phase of a gradient waveform.

FIG. 2 shows an example of an acquisition sequence 200 for measuring gradient fields during a ramp-up phase of a gradient waveform. The acquisition sequence 200 is generally performed as a calibration scan prior to performing an imaging procedure. The acquisition sequence 200 enables measurement of a residual error between an ideal gradient field of a gradient waveform depicted in the figure and an actual gradient field measured by the field camera after the gradient waveform is applied to the gradient coils 104. As shown, the acquisition window is configured such that the gradient field can be measured during the ramp-up phase of the gradient waveform during which short time constant eddy currents are often present within nearby conductive materials of the MRI system 100.

During the calibration scan, an excitation RF pulse is initially applied followed by a gradient waveform to one or more of the gradient coils 104. The field camera is then configured to measure the gradient field produced by the gradient coils 104 after the application of the gradient waveform. The field camera measures magnetic fields produced from localized areas of the MRI system that are expected to produce gradient fields (e.g., locations within the inner bore 101 corresponding to gradient coils of interest). As described above, because the signal is collected from a localized region, the time derivative of the phase of the signal is proportional to the magnetic field at that spatial location. The measured gradient field includes static field inhomogeneities produced by electromagnets of interest. The magnetic field produced solely by the electromagnet can be obtained by subtracting the measured magnetic field at each point when the electromagnet of interest is not powered.

Figure 3A:
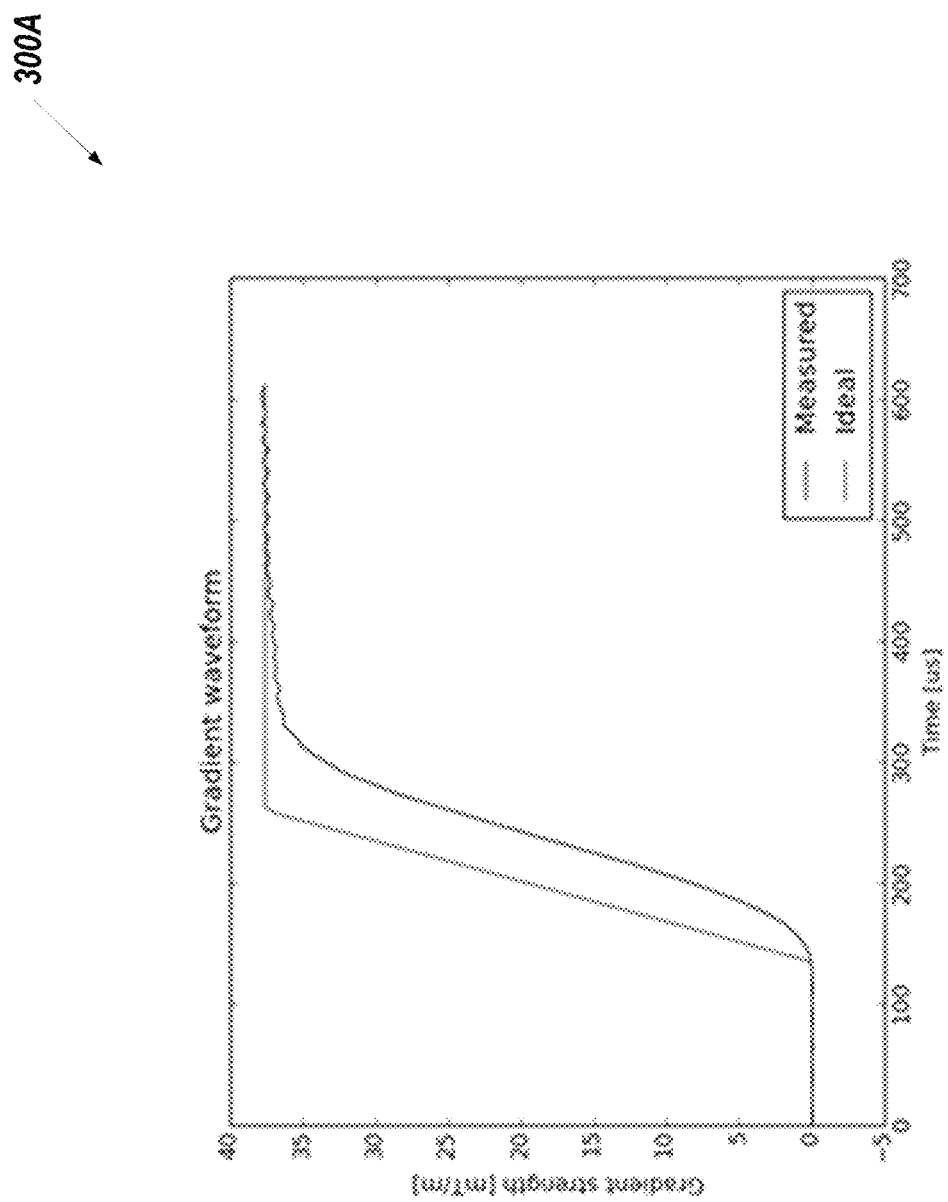
FIG. 3A shows an example of a chart that compares an ideal gradient field and a measured gradient field.

FIG. 3A shows an example of a chart 300A that compares an ideal gradient field and a measured gradient field. As described above, the measured gradient field can be obtained using an acquisition sequence (e.g., the acquisition sequence 200) in which gradient fields produced by one or more gradient coils 104 are measured during the ramp-up phase of a gradient waveform applied to the one or more gradient coils 104 after applying an excitation RF pulse. In the example illustrated in FIG. 3a, the chart 300A shows a comparison between an ideal gradient field specified by the applied gradient waveform and a measured gradient field of a gradient coil configured to generate a gradient field along the x-axis of the MRI system 100.

As shown, during the ramp-up phase of the applied gradient waveform (e.g., between around 100 μs to 250 μs in chart 200), a delay in time between the slope of the ideal gradient field and the measured gradient field is referred to as the gradient delay time. The rounding of the sharp corners of the measured gradient field relative to the ideal gradient field are attributed to the effect of induced eddy currents and the gradient amplifier response as described above. These distortions in the gradient waveform can cause unwanted distortions for images that are collected using the measured gradient field shown in FIG. 3A.

Once the actual gradient field produced by the gradient coil has been measured during the ramp-up phase, the error between the ideal gradient field and the measured gradient field can be analyzed as a function of time throughout the time period associated with the ramp-up phase. The measured error (comparing the measured temporal strength of the gradient field to the ideal gradient field) can then be fit against one or more temporal model functions as described in more detail below.

Figure 3B:
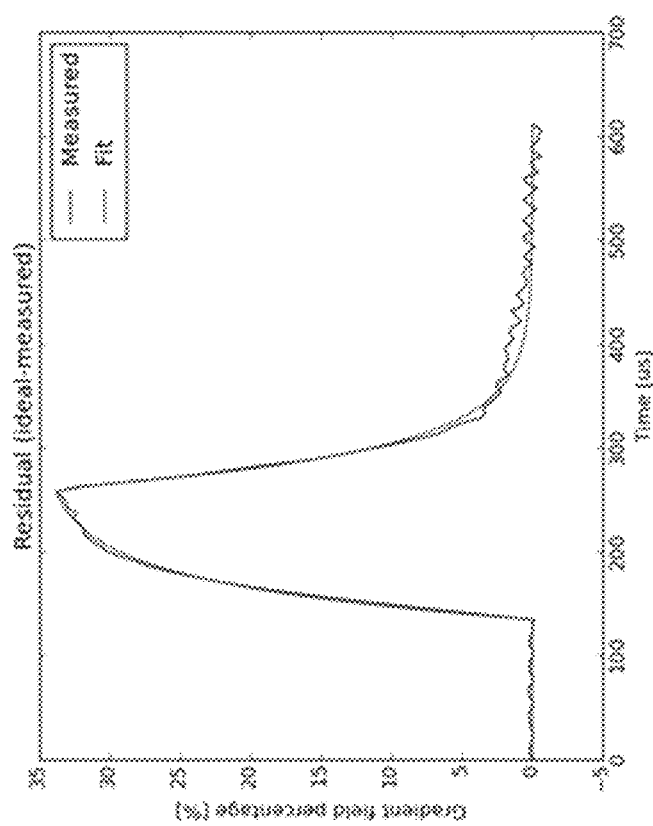
FIG. 3B shows an example of a chart that compares a time-dependent residual error of the measured and ideal gradient fields of FIG. 3A and a temporal model function for the measured time-dependent residual error.

FIG. 3B shows an example of a chart 300B that compares a time-dependent error of the measured gradient field of FIG. 3A and a temporal model function for the measured time-dependent error. The error of the measured gradient field in chart 300A can be plotted as a function of time. The measured gradient delay can then be fit to a temporal model function that represents the measured gradient delay as a finite element model. In some instances, the temporal model function can be represented as follows:

$$f = A \times \left(1 - e^{\frac{-(t-\tau_D)}{T}}\right)$$

During ramp time:

$$f = A \times e^{\frac{-(t-\tau_D-\tau_R)}{T}},$$

After ramp time:
where A=field amplitude, t=time, $T_D$=delay time, $T_R$=ramp time, and T=time constant.

In other instances, other types of temporal model functions can also be used. For example, other temporal model functions that expand the expression above to multiple exponential functions can also be used for improving the fit to the function for the measured error.

Once the measured error has been fit to a selected temporal model function, values of the parameters specified by the function (e.g., field amplitude, time constant) can be used to identify the impact of the eddy currents on the measured gradient field and apply compensation to the original gradient waveform to generate a pre-emphasized gradient waveform. As described above, the pre-emphasized gradient waveform substantially reduces any parasitic fields that can result from the eddy currents. In some instances, the pre-emphasized gradient waveform is generated based on initially convolving a negative of the exponentials for each parameter within the temporal model function with the time derivative of the gradient waveform. The convolved value can then be added to the original gradient waveform to compensate for the undesired effects of the magnetic fields produced by the eddy currents.

Figure 4A:
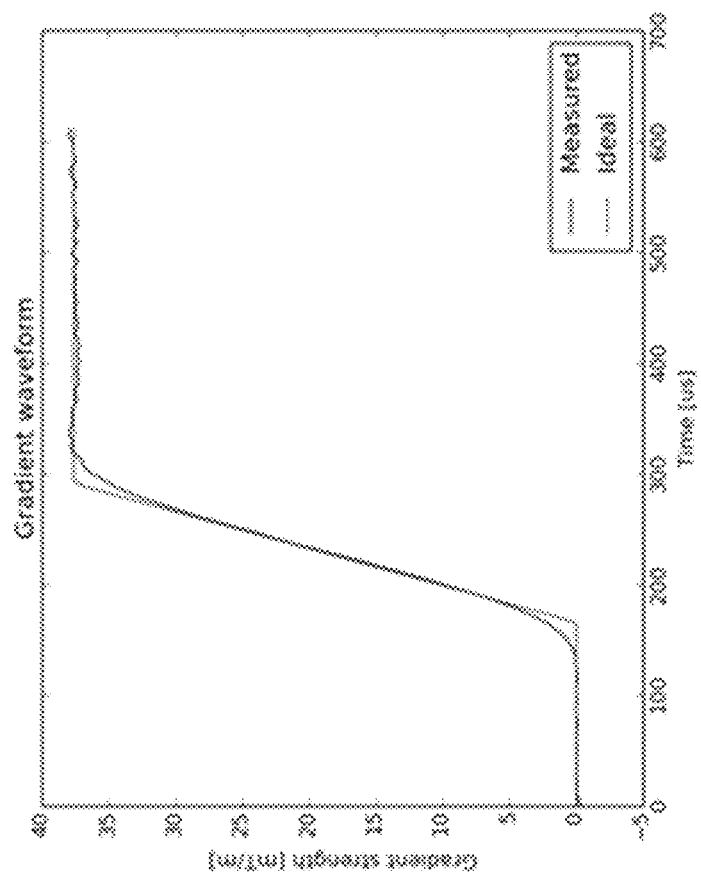
FIG. 4A shows an example of a chart that compares the ideal gradient field of FIG. 3A and a compensated gradient field.

FIG. 4A shows an example of a chart 400A that compares the ideal gradient field of FIG. 3A and a compensated gradient field. As described above, the compensated gradient field of the chart 400A is obtained by first fitting the difference between the ideal and measured gradient fields shown in FIG. 3A to a temporal model function that specifies parameters for estimating the short time constant eddy current amplitude and time constants. This data is then used to compute a pre-emphasized gradient waveform that is designed to substantially reduce the parasitic eddy current fields during the ramp-up phase of the original gradient waveform, and thereby minimize the error between the original waveform and a resultant compensated gradient field produced by a gradient coil as a result of applying the pre-emphasized gradient waveform.

As shown, the compensated gradient field that is measured exhibits minimal error compared to the ideal gradient waveform due to the substantial removal of the parasitic magnetic fields as described above. Compared to the original measured gradient field shown in chart 300A, the measured compensated gradient field also includes sharper peaks around the corners of the ideal gradient field. This reduction in the difference between the ideal and measured gradient waveforms indicates that the impact of the induced eddy currents present within nearby components of the MRI system 100 has been reduced.

Figure 4B:
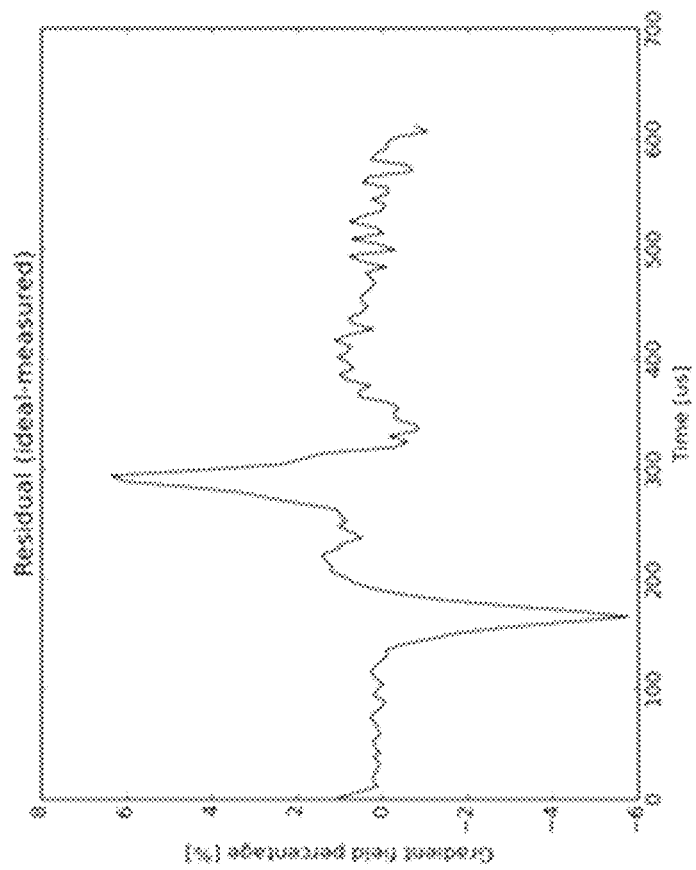
FIG. 4B shows an example of a chart that illustrates a time-dependent difference between the ideal gradient field of FIG. 3A and the compensated gradient field of FIG. 4A.

FIG. 4B shows an example of a chart 400B that illustrates a time-dependent difference between the ideal gradient field of FIG. 3A and the compensated gradient field of FIG. 4A. As shown, the change in the gradient field magnitudes around 150 μs to 200 μs corresponds to the start of the ramp-up phase of the original gradient waveform, whereas the change in the gradient field magnitudes around 250 μs to 350 μs corresponds to the end of the ramp-up phase. While these peaks are due to a lack of bandwidth of the gradient amplifier and cannot be corrected for, their sum should be near zero.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method for reducing eddy current artifacts of a magnetic resonance imaging (MRI) system having a main magnet that generates a substantially uniform magnetic field to image a subject therein, the method comprising:
   energizing a gradient sub-system of the MRI system such that a gradient corresponding to perturbations to the substantially uniform magnetic field are generated, the gradient having a temporal strength that includes a ramp-up phase; and
   during the ramp-up phase:
      measuring the temporal strength of the gradient, and
      fitting the measured temporal strength against one or more temporal model functions to generate a corrected gradient in which distortions caused by eddy currents during the ramp-up phase are substantially removed.

2. The method of claim 1, wherein fitting the measured temporal strength to generate the corrected gradient comprises fitting the measured temporal strength against one or more temporal model functions characterized by at least a first set of time constants and a second set of time constants;
subsequently extracting the first set of time constants and the second set of time constants from the one or more temporal model functions; and
incorporating the extracted first set of time constraints and the extracted second set of time constraints into a pre-emphasized gradient waveform which, when used to energize the gradient sub-system for imaging the subject placed in the main magnet, generates the corrected gradient.

3. The method of claim 1, wherein measuring the temporal strength of the gradient comprises:
recording radio frequency (RF) signals from a field camera having more than one probes placed in the substantially uniform magnetic field; and
measuring cumulative phases of the recorded RF signals that reflect the perturbations to the substantially uniform magnetic field at where the more than one probes were placed.

4. The method of claim 3, wherein measuring the temporal strength of the gradient further comprises:
determining the temporal strength of the gradient by taking a time derivative of the measured cumulative phases.

5. The method of claim 2, wherein fitting the measured temporal strength during the ramp-up phase further comprises:
simultaneously fitting against a first temporal model function characterized by the first set of time constants as well as a second temporal model function characterized by the first set of time constants and the second set of time constants.

6. The method of claim 1, wherein fitting the measured temporal strength comprises applying a fit only during the ramp-up phase.

7. The method of claim 1, wherein the corrected gradient is generated such that radio-frequency (RF) signals for reconstructing an MRI image of the subject are acquired from a k-space trajectory that is substantially identical to an ideal gradient waveform.

8. The method of claim 1, further comprising:
accessing data encoding a computational model for one or more components of the gradient sub-system, wherein the computational model specifies ideal gradient amplitudes for each of the one or more components when the gradient corresponding to the perturbations to the substantially uniform magnetic field is generated;
determining measured gradient amplitudes of the one or more components after energizing the gradient sub-system;
comparing, for each of the one or more components of the gradient sub-system, the measured gradient amplitude and the ideal gradient amplitude specified by the computational model; and
determining a first set of time constants and a second set of time constants based on a comparison of the measured gradient amplitude and the ideal gradient amplitude for each of the one or more components of the gradient sub-system.

9. The method of claim 1, wherein gradient runs along at least one spatial axis within the substantially uniform magnetic field.

10. The method of claim 1, wherein the method for reducing eddy current artifacts of the MRI system is performed by a computing system comprising one or more computers, and one or more storage devices storing instructions that, when executed by the one or more computers, cause the one or more computers to perform operations of the method.

11. A method for reducing eddy current artifacts of a magnetic resonance imaging (MRI) system having a main magnet that generates a substantially uniform magnetic field to image a subject therein, the method comprising:
accessing data encoding a gradient waveform that would otherwise be used on a gradient sub-system of the MRI system to generate a gradient that corresponds to perturbations to the substantially uniform magnetic field;
accessing data encoding one or more temporal model functions indicative of eddy current parameters during a ramp-up phase of the gradient;
pre-emphasizing the gradient waveform base on, at least in part, the eddy current parameters; and
driving the gradient sub-system using the pre-emphasized gradient waveform such that distortions to the gradient caused by eddy currents during the ramp-up phase are substantially removed.

12. The method of claim 11, comprising:
receiving and sampling radio-frequency (RF) signals from the subject placed in the main magnetic field when the gradient sub-system is being driven using the pre-emphasized gradient waveform as if the gradient sub-system is being driven using the gradient waveform.

13. The method of claim 11, wherein pre-emphasizing the gradient waveform comprises:
taking a time derivative of the gradient waveform; and
convolving the one or more temporal model functions with the time derivative of the gradient waveform.

14. The method of claim 13, wherein pre-emphasizing the gradient waveform comprises:
subtracting, from the gradient waveform, results of convolving the one or more temporal model functions with the time derivative of the gradient waveform.

15. The method of claim 13, wherein pre-emphasizing the gradient waveform comprises:
adding, from the gradient waveform, results of convolving the one or more temporal model functions with the time derivative of the gradient waveform.

16. The method of claim 11, wherein the gradient corresponds to perturbation to the main magnetic field along at least one spatial axis.

17. The method of claim 11, wherein the gradient waveform represents at least one of: a gradient echo acquisition, a spin echo acquisition, an echo-planar imaging (EPI) acquisition, or a spiral acquisition.

18. The method of claim 11, wherein the gradient waveform leads to an accumulation of phase errors caused by eddy currents, and wherein the accumulation of phase errors is substantially removed by the pre-emphasized gradient waveform.

19. A magnetic resonance imaging (MM) system, comprising:
a housing having a bore in which a subject to be imaged is placed;
a main magnet accommodated by said housing and configured to generate a substantially uniform magnetic field within the bore;
a group of shimming coils placed around said housing and configured to increase a homogeneity of the substantially uniform magnetic field;
pulse generating coils to generate and apply radio frequency (RF) pulses in sequence to scan the subject;

a gradient sub-system comprising gradient coils to provide perturbations to the substantially uniform magnetic field;
a control unit coupled to the main magnet and configured to:
energize a gradient sub-system of the MRI system such that a gradient corresponding to perturbations to the substantially uniform magnetic field are generated, the gradient having a temporal strength that includes a ramp-up phase; and
during the ramp-up phase:
measure the temporal strength of the gradient during the ramp-up phase, and
fit the measured temporal strength against one or more temporal model functions to generate a corrected gradient in which distortions caused by eddy currents during the ramp-up phase are substantially removed.

20. The MRI system of claim 19, wherein the control unit is configured to measure the temporal strength of the gradient by:
recording radio frequency (RF) signals from a field camera having more than one probes placed in the substantially uniform magnetic field; and
measuring cumulative phases of the recorded RF signals that reflect the perturbations to the substantially uniform magnetic field at where the more than one probes were placed.

21. The MRI system of claim 20, wherein the control unit is configured to measure the temporal strength of the gradient by:
determining the temporal strength of the gradient by taking a time derivative of the measured cumulative phases.

22. The MRI system of claim 19, wherein the control unit is configured to fit the measured temporal strength by:
applying a fit only during the ramp-up phase.

23. The MRI system of claim 19, wherein the corrected gradient is generated such that radio-frequency (RF) signals for reconstructing an MRI image of the subject are acquired from a k-space trajectory that is substantially identical to an ideal gradient waveform.

24. The MRI system of claim 19, wherein the control unit is further configured to:
access data encoding a computational model for one or more components of the gradient sub-system, wherein the computational model specifies ideal gradient amplitudes for each of the one or more components when the gradient corresponding to the perturbations to the substantially uniform magnetic field is generated;
determine measured gradient amplitudes of the one or more components after energizing the gradient sub-system;
compare, for each of the one or more components of the gradient sub-system, the measured gradient amplitude and the ideal gradient amplitude specified by the computational model; and
determine a first set of time constants and a second set of time constants based on a comparison of the measured gradient amplitude and the ideal gradient amplitude for each of the one or more components of the gradient sub-system.

25. The MRI system of claim 19, wherein gradient runs along at least one spatial axis within the substantially uniform magnetic field.

* * * * *